(12) United States Patent
Zhang et al.

(10) Patent No.: US 10,868,102 B1
(45) Date of Patent: Dec. 15, 2020

(54) ORGANIC LIGHT EMITTING DISPLAY PANEL AND DISPLAY DEVICE

(71) Applicant: WuHan TianMa Micro-electronics CO., LTD, Wuhan (CN)

(72) Inventors: Guofeng Zhang, Wuhan (CN); Junqiang Wang, Wuhan (CN)

(73) Assignee: WuHan TianMa Micro-electronics CO., LTD., Wuhan (CN)

( * ) Notice: Subject to any disclaimer, the term of this patent is extended or adjusted under 35 U.S.C. 154(b) by 0 days.

(21) Appl. No.: 16/732,082

(22) Filed: Dec. 31, 2019

(30) Foreign Application Priority Data

Aug. 28, 2019 (CN) .......................... 2019 1 0802981

(51) Int. Cl.
*H01L 27/32* (2006.01)
*H01L 51/52* (2006.01)
*H01L 23/00* (2006.01)

(52) U.S. Cl.
CPC ........ *H01L 27/3276* (2013.01); *H01L 23/562* (2013.01); *H01L 27/3262* (2013.01); *H01L 27/3265* (2013.01); *H01L 51/5253* (2013.01)

(58) Field of Classification Search
CPC ............. H01L 27/3276; H01L 27/3262; H01L 27/3265; H01L 23/562; H01L 51/5253

USPC .......................................................... 257/40
See application file for complete search history.

(56) References Cited

U.S. PATENT DOCUMENTS 10,748,974 B2 * 8/2020 Lee ...................... H01L 51/5256

FOREIGN PATENT DOCUMENTS

| CN | 107579171 A | 1/2018 |
|----|-------------|--------|
| CN | 109390494 A | 2/2019 |

\* cited by examiner

*Primary Examiner* — Tu-Tu V Ho
(74) *Attorney, Agent, or Firm* — Christensen O'Connor Johnson Kindness PLLC

(57) ABSTRACT

An organic light emitting display panel and a display device are provided. In the display panel, an organic light emitting layer is at a side of a blocking layer facing away from a substrate layer, the blocking layer includes a first organic insulating layer and a first inorganic insulating layer between the organic light emitting layer and the first organic insulating layer, and the substrate layer is at a side of the blocking layer facing away from organic light emitting layer. The blocking layer has a groove formed by recessing towards a side near substrate layer. The groove penetrates through the first inorganic insulating layer and is in the first organic insulating layer. In a direction from the display area to the opening area, one groove has an opening size smaller than a maximum size of the one groove. The organic light emitting layer is disconnected at the groove.

20 Claims, 10 Drawing Sheets

… (US 10,868,102 B1)

ORGANIC LIGHT EMITTING DISPLAY PANEL AND DISPLAY DEVICE

CROSS-REFERENCE TO RELATED APPLICATIONS

The present application claims priority to Chinese Patent Application No. 201910802981.4, filed on Aug. 28, 2019, the content of which is incorporated herein by reference in its entirety.

TECHNICAL FIELD

The present disclosure relates to the field of display technologies, and particularly, to an organic light emitting display panel and a display device.

BACKGROUND

Display technology has been widely used in various aspects of people's daily lives, and accordingly, more and more materials and technologies have been employed in display panels. In order to more fully utilize the space of the display panel, a screen-to-body ratio of the display panel is getting greater and greater, that is, a ratio of an area of a display area to an area of the display panel is getting greater and greater. With a larger area of the display area, space for disposing a front camera and the like is reduced, and a display panel whose display area is provided with an opening area is emerged, where the opening area is used for disposing the front camera and the like.

However, external water and oxygen may permeate to the display area via the opening area, causing a defective display.

SUMMARY

Embodiments of the present disclosure provide an organic light emitting display panel and a display device that can improve an encapsulation reliability of an opening area, thereby avoiding a defective display caused by an erosion of external water and oxygen.

In one aspect, an embodiment of the present disclosure provides an organic light emitting display panel. The organic light emitting display panel has an opening area, a first non-display area surrounding the opening area, and a display area surrounding the first non-display area. The organic light emitting display panel includes a substrate layer, a blocking layer and an organic light emitting layer that are stacked and located in the first non-display area. The organic light emitting layer is located at a side of the blocking layer facing away from the substrate layer. The blocking layer includes a first organic insulating layer and a first inorganic insulating layer. The first inorganic insulating layer is located between the organic light emitting layer and the first organic insulating layer. The substrate layer is at a side of the blocking layer facing away from the organic light emitting layer. The blocking layer is provided with at least one groove formed by recessing towards a side close to the substrate layer, and each of the at least one groove penetrates through the first inorganic insulating layer and is formed at the first organic insulating layer. In a direction from the display area to the opening area, one of the at least one groove has an opening size smaller than a maximum size of the one of the at least one groove. The organic light emitting layer is disconnected at the at least one groove.

In another aspect, an embodiment of the present disclosure provides a display device including the organic light emitting display panel as mentioned above.

BRIEF DESCRIPTION OF DRAWINGS

In order to illustrate technical solutions of embodiments of the present disclosure or the technical solutions in the related arts, the accompanying drawings used in the embodiments or description of the related arts are introduced hereinafter. These drawings illustrate some embodiments of the present disclosure.

DESCRIPTION OF EMBODIMENTS

In order to make the purpose, technical solution and advantages of the embodiments of the present application clearer, the technical solutions in the embodiments of the present disclosure are described in detail with reference to the accompanying drawings. The described embodiments are merely part of the embodiments of the present disclosure rather than all of the embodiments.

The terms used in the embodiments of the present disclosure are for describing specific embodiments, rather than limiting the present disclosure. The terms "a", "an", "the" and "said" in a singular form in the embodiments of the present disclosure and the attached claims are also intended to include plural forms thereof, unless noted otherwise.

Figure 1:
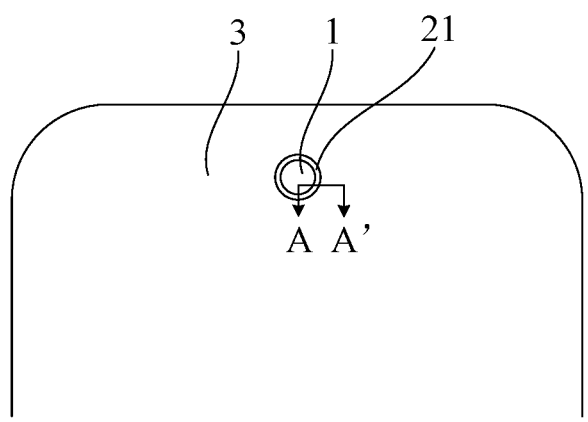
FIG. 1 is a top view of a partial region of a display panel according to some embodiments of the present disclosure.
Figure 2:
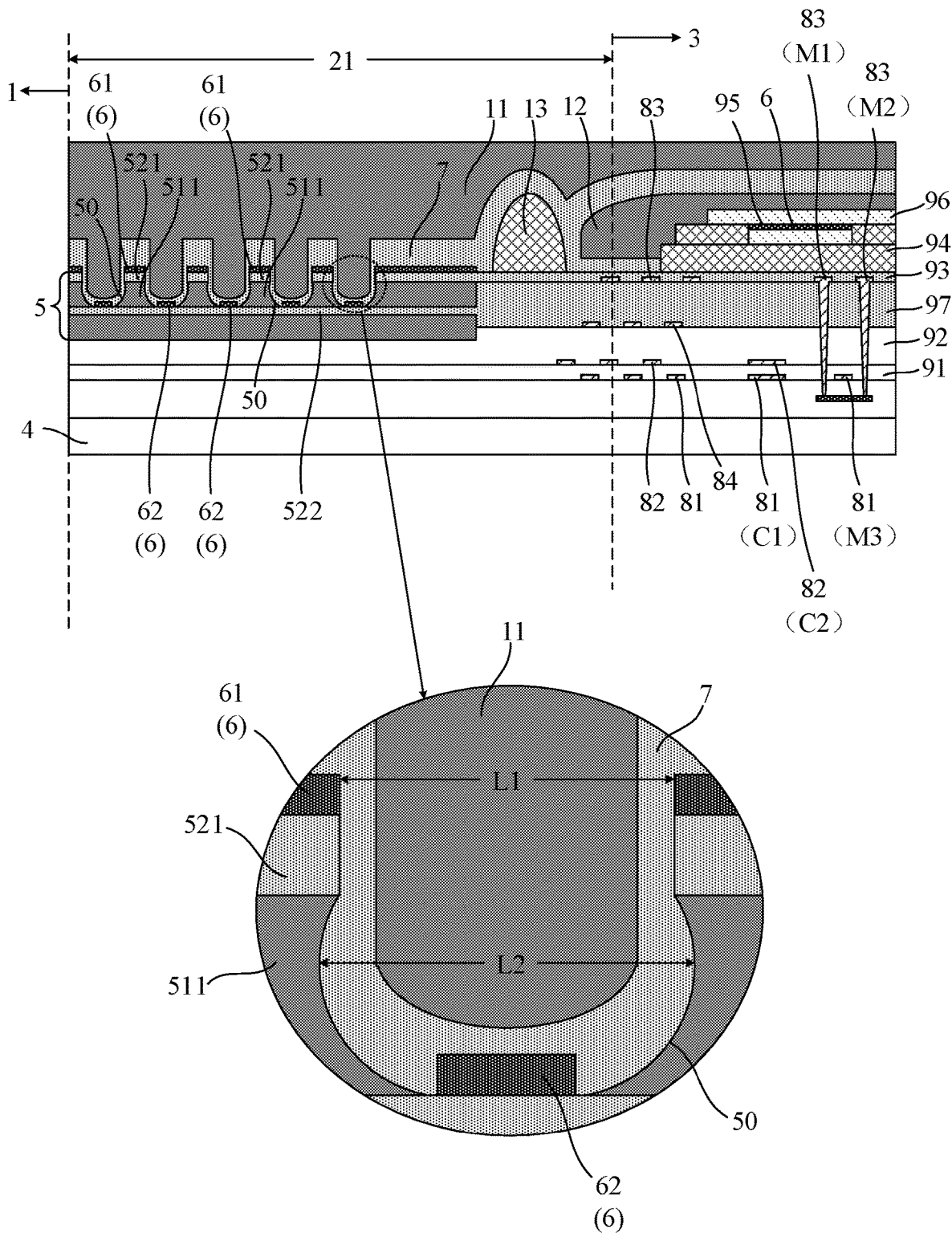
FIG. 2 is a sectional view of the display panel taken alone line AA' in FIG. 1.

FIG. 1 is a top view of a partial region of a display panel according to some embodiments of the present disclosure. FIG. 2 is a sectional view of the display panel taken alone line AA' in FIG. 1. As shown in FIG. 1 and FIG. 2, an organic light emitting display panel provided by embodiments of the present disclosure has an opening area 1, a first non-display area 21 surrounding the opening area 1, and a display area 3 surrounding the first non-display area 21. The organic light emitting display panel includes a substrate layer 4, a blocking layer 5, and an organic light emitting layer 6 that are located in the first non-display area 21 and are stacked. The organic light emitting layer 6 is located at a side of the blocking layer 5 facing away from the substrate layer 4. The blocking layer 5 includes a first organic insulating layer 511 and a first inorganic insulating layer 521. The first inorganic insulating layer 521 is located between the organic light emitting layer 6 and the first organic insulating layer 511. The substrate layer 4 is located at a side of the blocking layer 5 facing away from the organic light emitting layer 6. The blocking layer 5 is provided with at least one groove 50 formed by recessing towards a side close to the substrate layer 4, and the groove 50 penetrates through the first inorganic insulating layer 521 and is formed in the first organic insulating layer 511. An opening size L1 of the groove 50 is smaller than a maximum size L2 of the groove on a plane of the organic light emitting display panel. That is, a section of the groove 50 in FIG. 2 forms an inverted T shape structure. The inverted T shape structure can be formed by using different etching rates of the first organic insulating layer 511 and the first inorganic insulating layer 521. An etching rate of the first organic insulating layer 511 is higher than an etching rate of the first inorganic insulating layer 521. By etching the first organic insulating layer 511 and the first inorganic insulating layer 521 with different etching rates, the section of the groove 50 forms the inverted T shape structure, and the organic light emitting layer 6 is disconnected at the groove 50.

In an embodiment, the substrate layer 4 serves as a substrate for the entire display panel. For example, the substrate layer 4 includes multiple layers which includes a polyimide layer, an inorganic layer, and a polyimide layer that are sequentially stacked. The organic light emitting layer 6 is an organic layer. External water and oxygen can permeate along the organic light emitting layer and intrude into the display panel, affecting a stability of the display panel. In the present disclosure, the blocking layer 5 is provided with the groove 50 to make the organic light emitting layer 6 be disconnected, causing the organic light emitting layer 6 in the opening area 1 and the organic light emitting layer 6 in the display area 3 to be disconnected from each other, and thereby causing an intrusion path of the water and oxygen to be cut off. Even if the water and oxygen permeate into the organic light emitting layer 6 in the opening area 1, the water and oxygen cannot intrude into the display area 3 via the organic light emitting layer 6, thereby avoiding a display caused by an erosion of the external water and oxygen. The quantity of the grooves 50 is not limited, and at least one groove 50 is provided. The opening area 1 refers to such an area where a layer of the display panel is removed to improve a light transmittance of the opening area 1 for disposing elements such as a front camera. As shown in FIG. 2, all layers of the display panel are removed. In other embodiments, some layers are reserved in the opening area 1, for example, a layer that have a large light transmittance is reserved. Due to the arrangement of the groove 50, a part of the organic light emitting layer 6 is arranged outside the groove 50 while another part of the organic light emitting layer 6 is arranged in the groove 50 during a manufacturing process of the organic light emitting layer 6, such that there is a step between the organic light emitting layer 6 in the groove 50 and the organic light emitting layer 6 outside the groove 50, which causes the organic light emitting layer 6 to be disconnected. As shown in the top view of FIG. 1, on the plane of the display panel, the opening area 1 is completely surrounded by the groove 50, such that the part, at the edge of the opening area 1, of the organic light emitting layer 6 is completely disconnected from the part, in the display area 3, of the organic light emitting layer 6. The groove 50 penetrates through the first inorganic insulating layer 521 and is formed in the first organic insulating layer 511, that is, a side wall of the groove 50 is formed by at least the first inorganic insulating layer 521 and the first organic insulating layer 511. In the first non-display area 21, a surface of the organic light emitting layer 6 is encapsulated by an inorganic encapsulation layer 7. The inorganic encapsulation layer 7 is attached to the side wall of the groove 50. A bonding strength between the inorganic encapsulation layer 7 and an insulating material is strong, so a better encapsulation can be achieved. Further, in the first non-display area 21, a top surface of the organic light emitting layer 6 outside the groove 50 is in direct contact with the inorganic encapsulation layer 7, and a bottom surface of the organic light emitting layer 6 outside the groove 50 is in direct contact with the first inorganic insulating layer 521. At the edge of the groove 50, the organic light emitting layer 6 is coated by the inorganic encapsulation layer 7 and the first inorganic insulating layer 521. Since there is a stronger bonding strength between the inorganic encapsulation layer 7 and the first inorganic insulating layer 521, the encapsulation effect is improved, avoiding the erosion of the external water and oxygen. The layers for forming the groove 50 include the organic insulating layer and the inorganic insulating layer that are located between the substrate layer 4 and the organic light emitting layer 6. The groove 50 can be formed by performing a patterning process on the first organic insulating layer 511 and the first inorganic insulating layer 521 that are located between the substrate layer 4 and the organic light emitting layer 6, and no additional process is required, thereby reducing the process cost. In an embodiment, the organic light emitting layer 6 can include a light emitting material layer and at least one of: a hole transport layer, a hole injection layer, an electron transport layer, and/or an electron injection layer.

In the organic light emitting display panel of the embodiments of the present disclosure, the groove is formed in the first non-display area by utilizing the inorganic insulating layer and the organic insulating layer that are located between the substrate layer and the organic light emitting layer, the part of the organic light emitting layer at the edge of the opening area and the part of the organic light emitting layer in the display area are disconnected from each other by the groove, such that the defective display caused by the intrusion of water and oxygen into the display area via the organic light emitting layer is avoided, the encapsulation effect around the opening area is improved, additional process is not needed, and the process cost is reduced. Since the organic light emitting layer in the first non-display area is directly coated by the inorganic encapsulation layer and the first inorganic insulating layer, the bonding strength is strong, and the encapsulation effect is improved.

In an embodiment, the organic light emitting layer 6 includes a first part 61 attached to a surface of the blocking layer 5 outside the groove 50, and a second part 62 attached to a bottom of the groove 50. The first part 61 and the second part 62 are disconnected from each other. The organic light emitting display panel further includes an inorganic encapsulation layer 7 disposed at a side of the organic light emitting layer 6 facing away from the blocking layer 5. The inorganic encapsulation layer 7 is attached to the first part 61, the second part 62, and the side wall of the groove 50, that is, the inorganic encapsulation layer 7 is attached to parts of the first organic insulating layer 511 and the first inorganic insulating layer 521 located in the groove 50 and exposed to the organic light emitting layer 6.

Figure 3:
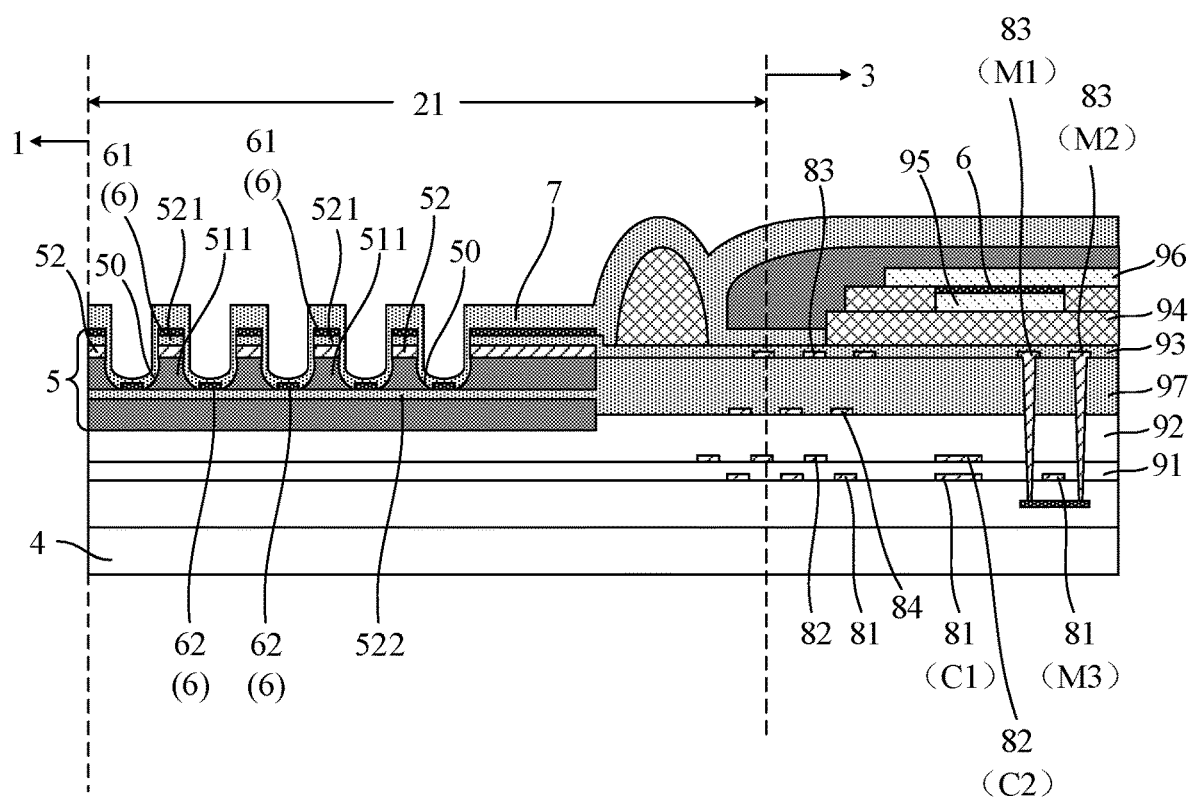
FIG. 3 is another sectional view of the display panel taken along line AA' in FIG. 1.

FIG. 3 is another sectional view of the display panel taken along line AA' in FIG. 1. In one or more embodiments, as shown in FIG. 3, the blocking layer 5 further includes a metal cushion layer 52 located between the first inorganic insulating layer 521 and the first organic insulating layer 511. The groove 50 penetrates through the metal cushion layer 52, that is, the metal cushion layer 52 is formed at the edge of the groove 50 and serves as a part of the side wall of the groove 50. In this way, the first part 61 of the organic light emitting layer 6 is also supported by the metal cushion layer 52, and the second part 62 of the organic light emitting layer 6 is not supported by the metal cushion layer 52, that is, a step between the first pat 61 and the second part 62 is increased by providing the metal cushion layer 52. The metal cushion layer 52 can be formed by using an existing metal layer of the organic light emitting display panel, the first organic insulating layer 511 is located below the metal cushion layer 52. The formation of the groove 50 in the first organic insulating layer 511 takes a relatively long time. Therefore, through increasing a step of the groove 50, e.g., by providing the metal cushion layer 52, the process cost is reduced.

Figure 4:
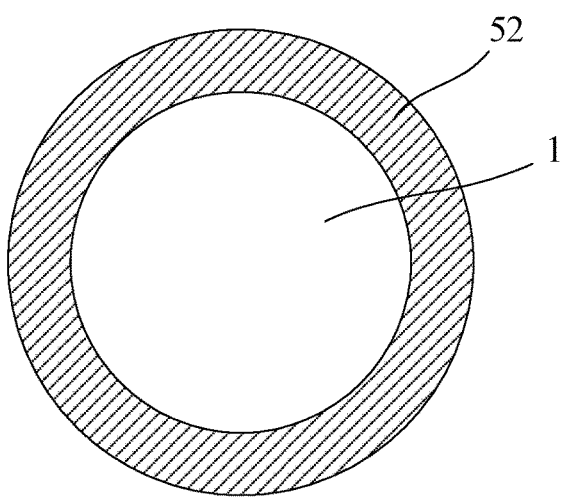
FIG. 4 is a top view of a metal cushion layer according to some embodiments of the present disclosure.

FIG. 4 is a top view of the metal cushion layer according to some embodiments of the present disclosure. In one or more embodiments, as shown in FIG. 4, the metal cushion layer 52 surrounds the opening area 1 to form an enclosed ring-shaped structure, and the enclosed ring-shaped structure is electrically connected to a fixed potential, for example, the enclosed ring-shaped structure is grounded. The metal ring-shaped structure can have a signal shielding function and configuration. When the organic light emitting display panel is applied in a display device, signal lines for displaying are disposed outside the opening area 1, elements such as a front camera and the like are disposed in the opening area 1, so the ring-shaped structure of the metal cushion layer 52 can realize signal shielding, thereby preventing interference between signals inside the opening area 1 and signals outside the opening area 1.

In one or more embodiments, the metal cushion layer 52 can be formed by winding of a signal line that surrounds the opening area. In order to ensure performances such as a light transmittance of the opening area and the like, it is needed to wind metal signal lines (such as a data line, a first power signal line and so on) in the first non-display area 21 adjacent to the opening area 1. These signal lines that surround the opening area 1 can be reused as the metal cushion layer 52 to increase the step between the first part 61 and the second part 62.

Figure 5:
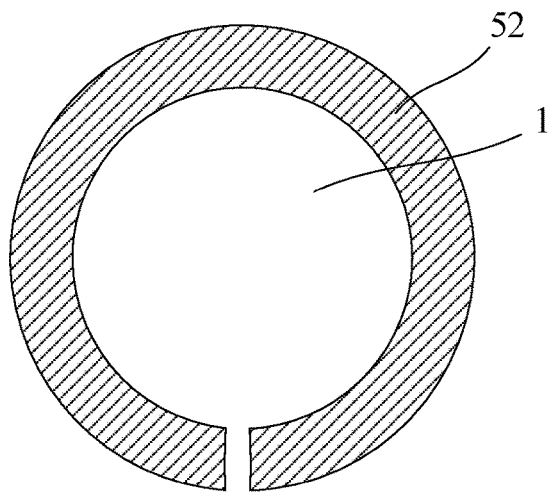
FIG. 5 is a top view of another metal cushion layer according to some embodiments of the present disclosure.

FIG. 5 is a top view of another metal cushion layer according to some embodiments of the present disclosure. As shown in FIG. 5, the metal cushion layer 5 surrounds the opening area 1 to forms a broken ring-shaped structure, and the broken ring-shaped structure is electrically connected to a crack detection device. The broken ring-shaped structure is electrically connected to a fixed potential.

Since at least part of layers in the opening area 1 of the organic light emitting display panel are removed, cracks may be generated at the edge of the opening area 1 of the organic light emitting display panel. The display performance may be affected if the cracks extend into the display area 3 or if water and oxygen permeate into the cracks. Therefore, the ring-shaped structure surrounding the opening area 1 can be can formed as a crack detection device by using the metal cushion layer 52. Different from the ring-shaped structure in FIG. 4, the ring-shaped structure for crack detection is a non-enclosed ring-shaped structure, that is, the ring-shaped structure has a disconnection part, such that an end of the disconnection part is connected to the crack detection device to detect cracks.

Figure 6:
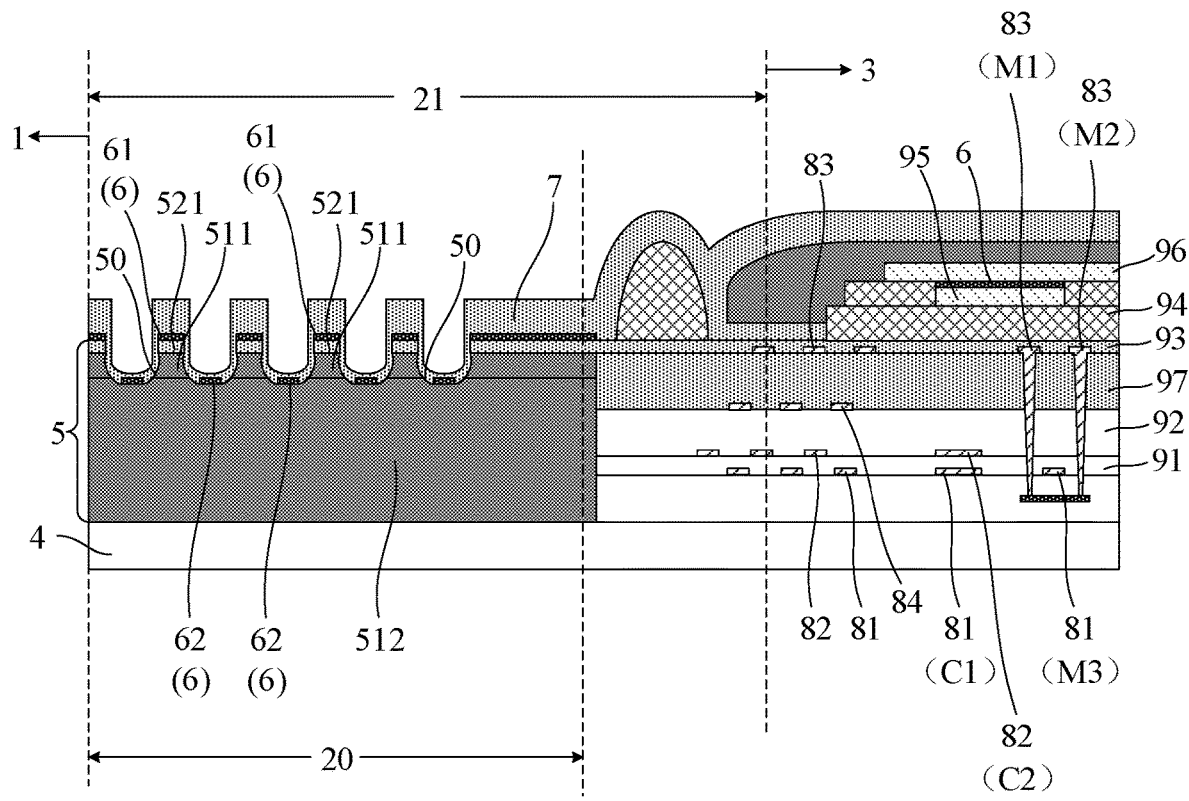
FIG. 6 is another sectional view of the display panel taken along line AA' in FIG. 1.

FIG. 6 is another sectional view of the display panel taken along line AA' in FIG. 1. As shown in FIG. 6, the first non-display area 21 includes a crack propagation preventing area 20. The crack propagation preventing area 20 surrounds the opening area 1. The groove 50 is located in the crack propagation preventing area 20. In the crack propagation preventing area 20, a first layer made of an organic material is provided (e.g., only a first layer made of organic material is provided) between the first inorganic insulating layer 521 and the substrate layer 4, and the first layer made of the organic material includes the first organic insulating layer 511.

Taking the structure shown in FIG. 6 as an example, the bottom of the groove 50 is formed by the second organic insulating layer 512. Since cracks are likely generated in the layer made of the inorganic material, in crack propagation preventing area 20, the layer made of the organic material is provided (e.g., only the layer made of the organic material is provided) between the first inorganic insulating layer 521 and the substrate layer 4. That is, the layer made of the inorganic material is disconnected by the groove 50 so as to prevent the crack generated in the layer made of the inorganic material at the edge of the opening area 1 from extending into the display area, thereby avoiding the defective display caused by the cracks.

Figure 7:
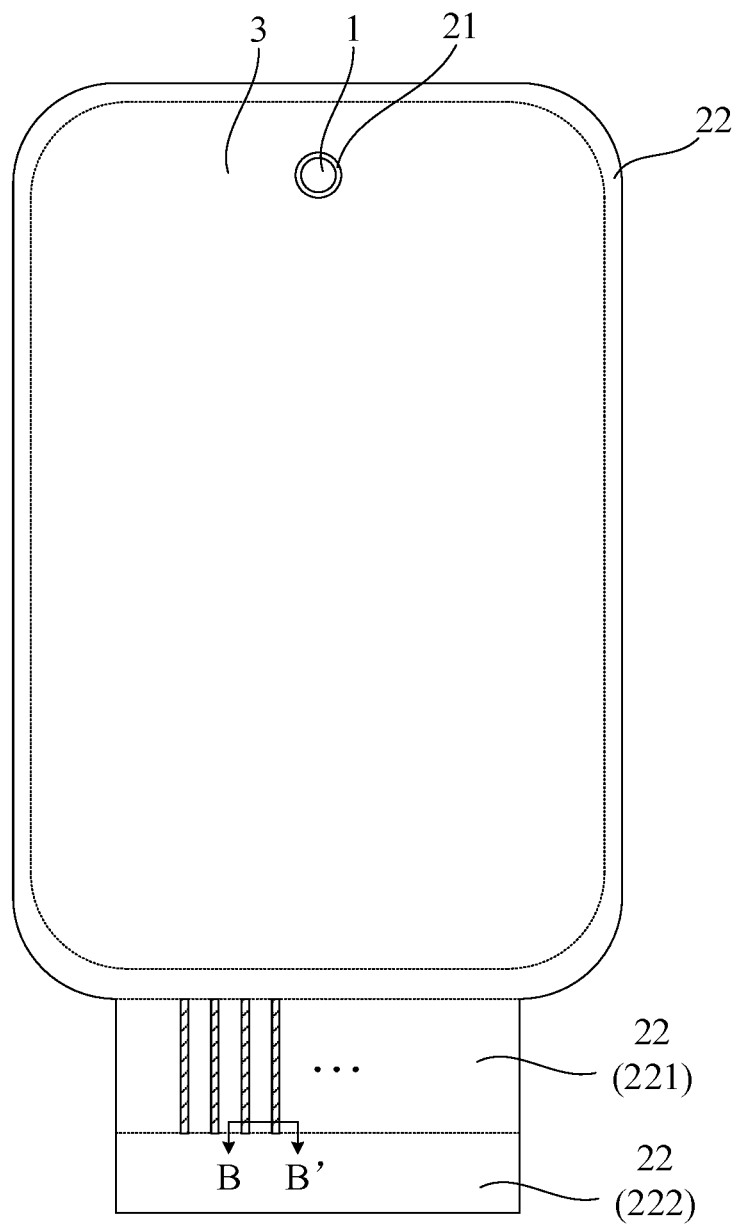
FIG. 7 is a top view of an organic light emitting display panel according to some embodiments of the present disclosure.
Figure 8:
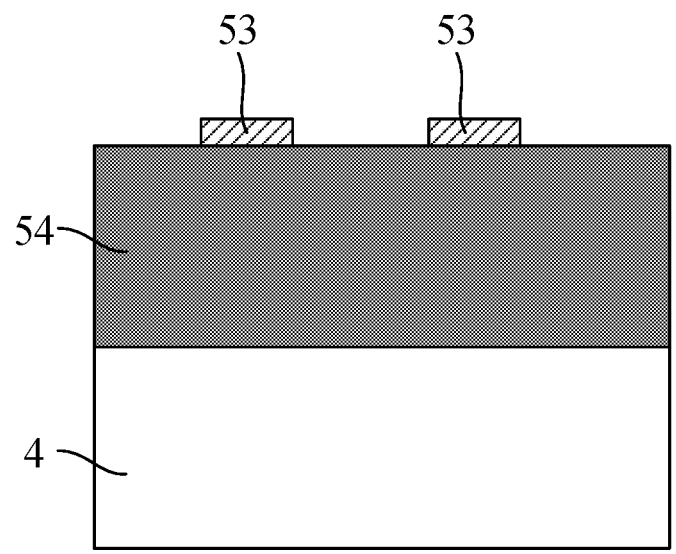
FIG. 8 is a sectional view of the organic light emitting display panel taken alone line BB' in FIG. 7.

FIG. 7 is a top view of an organic light emitting display panel according to some embodiments of the present disclosure. FIG. 8 is a sectional view of the organic light emitting display panel taken alone line BB' in FIG. 7. In some embodiments, as shown in FIG. 2, FIG. 3, FIG. 7, and FIG. 8, the organic light emitting display panel further has a second non-display area 22 surrounding the display area 3. The second non-display area 22 includes a bending area 221 and a bonding area 222, and the bonding area 222 is located at a side of the bending area 221 facing away from the display area 3. The bending area 221 includes a metal wiring layer 53 and an organic protecting layer 54 that are stacked, and the organic protecting layer 54 and the first organic insulating layer 511 are disposed in a same layer.

In an embodiment, when the organic light emitting display panel is applied in a display device, the bonding area 222 is configured to bond to a driving chip or a flexible circuit board. A part of the organic light emitting display panel in the bending area 221 is bent to a back surface of the organic light emitting display panel. The metal wiring layer 53 disposed in the bending area 221 of the organic light emitting display panel is configured to form signal lines, such that devices located on a front surface of the organic light emitting display panel are connected to the bonding area 222 via the signal lines in the bending area 221. The signal lines formed by the metal wiring layer 53 are prone to be broken by force when being bent, so an organic protecting layer 54 is provided adjacent to the metal wiring layer 53. Stress is released through the organic material, such that the metal wiring layer 53 is protected from being broken. In the first non-display area 21, the first organic insulating layer 511 for forming the groove 50 and the organic protecting layer 54 in the bending area 221 are disposed in a same layer, and no additional organic material is required, which can reduce the process cost.

In one or more embodiments, as shown in FIG. 2, the blocking layer 5 further includes a second inorganic insulation layer 522. The first organic insulating layer 511 is located between the first inorganic insulating layer 521 and the second inorganic insulating layer 522. The groove 50 penetrates through the first organic insulating layer 511, and the bottom of the groove 50 is formed by the second inorganic insulating layer 522. Since the inorganic encapsulation layer 7 has a strong bonding strength with the inorganic material layer, by forming the bottom of the groove 50 using the second inorganic insulating layer 522, the inorganic encapsulation layer 7 is bonded to the second inorganic insulation layer 522 at the bottom of the groove 50, which increases the encapsulation effect.

Figure 9:
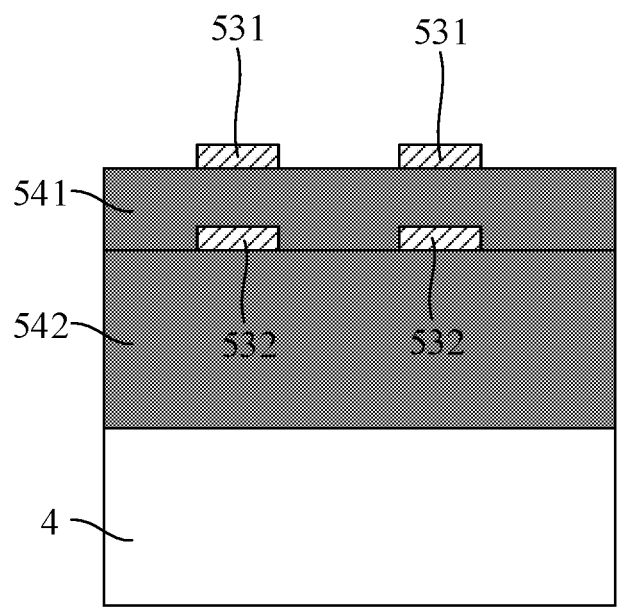
FIG. 9 is another sectional view of the organic light emitting display panel taken alone line BB' in FIG. 7.

FIG. 9 is another sectional view of the organic light emitting display panel taken alone line BB' in FIG. 7. In one or more embodiment, as shown in FIG. 6, FIG. 7, and FIG. 9, the blocking layer further includes a second organic insulating layer 512, and the first organic insulating layer 511 is located between the first inorganic insulating layer 521 and the second organic insulating layer 512. The groove 50 penetrates through the first organic insulating layer 511, and the bottom of the groove 50 is formed by the second organic insulating layer 512. The organic light emitting display panel further has a second non-display area 22 surrounding the display area 3. The second non-display area 22 includes a bending area 221 and a bonding area 222, and the bonding area 222 is located at a side of the bending area 221 facing away from the display area 3. The bending area 221 includes a first metal wiring layer 531, a first organic protecting layer 541, a second metal wiring layer 532, and a second organic protecting layer 542 that are stacked sequentially. The first organic protecting layer 541 and the first organic insulating layer 511 are disposed in a same layer (e.g., a first layer), and the second organic protecting layer 542 and the second organic insulating layer 512 are disposed in a same layer (e.g., a second layer).

An etching rate of an organic insulating layer is higher than an etching rate of the inorganic insulating layer, so when a designed thickness of the first organic insulating is not sufficient for providing a sufficient step for making the first part 61 and the second part 62 of the organic light emitting layer 6 be disconnected. The groove 50 can be formed by using two organic layers, i.e., the first organic insulating layer 511 and the second organic insulating layer 512, increasing an etching rate of the groove 50 while ensuring the step of the groove 50. In the bending area 221, wires in the bending area are formed by two metal layers, such that more wires are provided in a definite space. The first metal wiring layer 531 is protected by the first organic protecting layer 541, and the second metal wiring layer 532 is protected by the second organic protecting layer 542.

Figure 10:
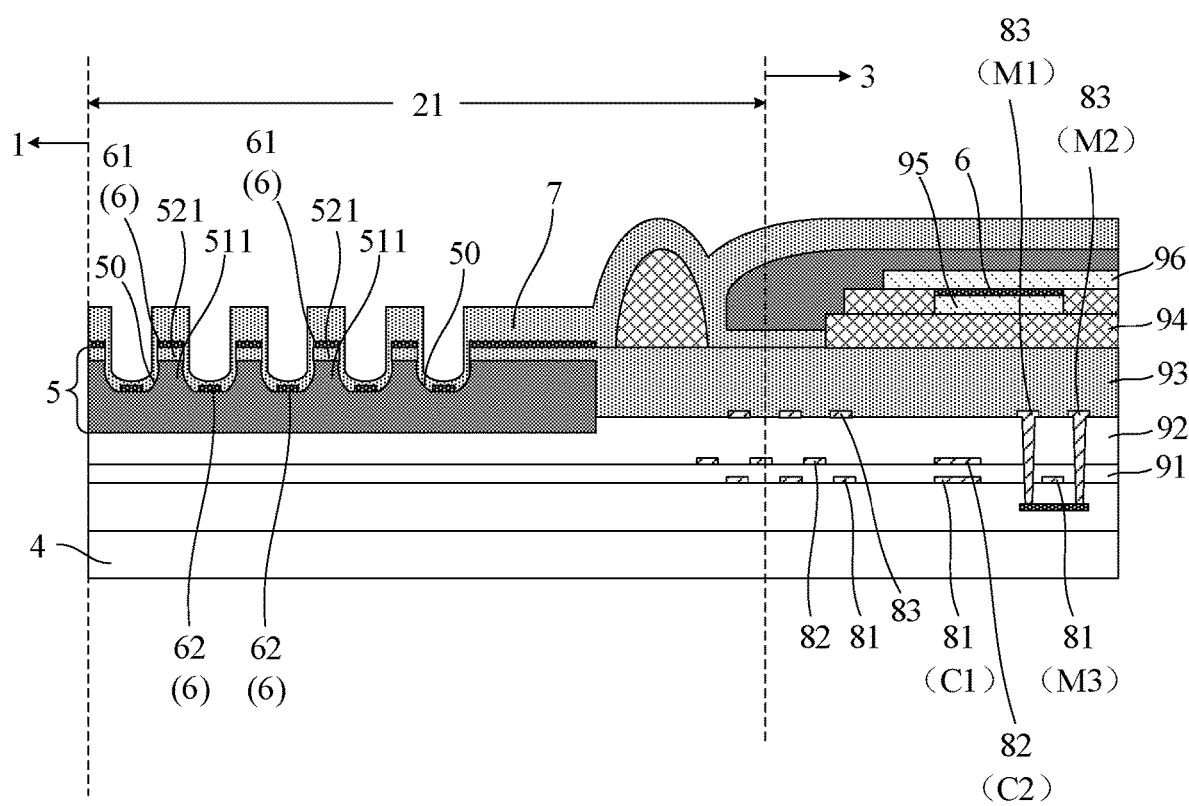
FIG. 10 is another sectional view of the display panel taken along line AA' in FIG. 1.

FIG. 10 is another sectional view of the display panel taken along line AA' in FIG. 1. In an embodiment, as shown in FIG. 10, the bottom of the groove 50 is formed by the first organic insulating layer 511. The groove 50 is formed through one organic insulating layer (e.g., only one organic insulating layer), improving a manufacturing efficiency.

In one or more embodiments, as shown in FIG. 2, FIG. 3, FIG. 6 and FIG. 10, the organic light emitting display panel in the display area 3 includes a first metal layer 81, a first insulating layer 91, a second metal layer 82, a second insulating layer 92, a third metal layer 83, a third insulating layer 93, a planarization layer 94, an anode layer 95, the organic light emitting layer 6, and a cathode layer 96. The organic light emitting display panel in the display area 3 includes a thin film transistor, and the thin film transistor includes a source electrode M1, a drain electrode M2 and a gate electrode M3. A capacitor includes a first electrode plate C1 and a second electrode plate C2. The gate electrode M3 and the first electrode plate C1 are located at the first metal layer 81. The second electrode plate C2 is located at the second metal layer 82. The source electrode M1 and the drain electrode M2 are located at the third metal layer 83. The first inorganic insulating layer 521 and the third insulating layer 93 are disposed in a same layer.

In one or more embodiments, as shown in FIG. 2, FIG. 3, and FIG. 6, the organic light emitting display panel in the display area 3 further includes a fourth metal layer 84 and a fourth insulating layer 97. The fourth metal layer 84 is located between the third metal layer 83 and the second insulating layer 92, and the fourth insulating layer 97 is located between the third metal layer 83 and the fourth metal layer 84. A part of the source electrode M1 is located at the third metal layer 83 and another part of the source electrode M1 is located at the fourth metal layer 84, or a part of the drain electrode M2 is located at the third metal layer 83 and another part of the drain electrode M2 is located at the fourth metal layer 84. Different from the structure shown in FIG. 10, as shown in FIG. 2, FIG. 3, and FIG. 6, the third metal layer 83 and the fourth metal layer 84 are used for implementing the signal wires and the arrangement of the source electrode and the drain electrode. By implementing two layers of signal wires through the third metal layer 83 and the fourth metal layer 84, a voltage drop of a wire is reduced, improving a uniformity of signal transmission in the display area. In the structure shown in FIG. 2, FIG. 3 and FIG. 6, one thin film transistor is illustrated, that is, the structure in which both the source electrode M1 and the drain electrode M2 are located at the third metal layer 83 is illustrated, a structure in which both the source electrode M1 and the drain electrode M2 are located at the fourth metal layer 84 is not illustrated.

Figure 11:
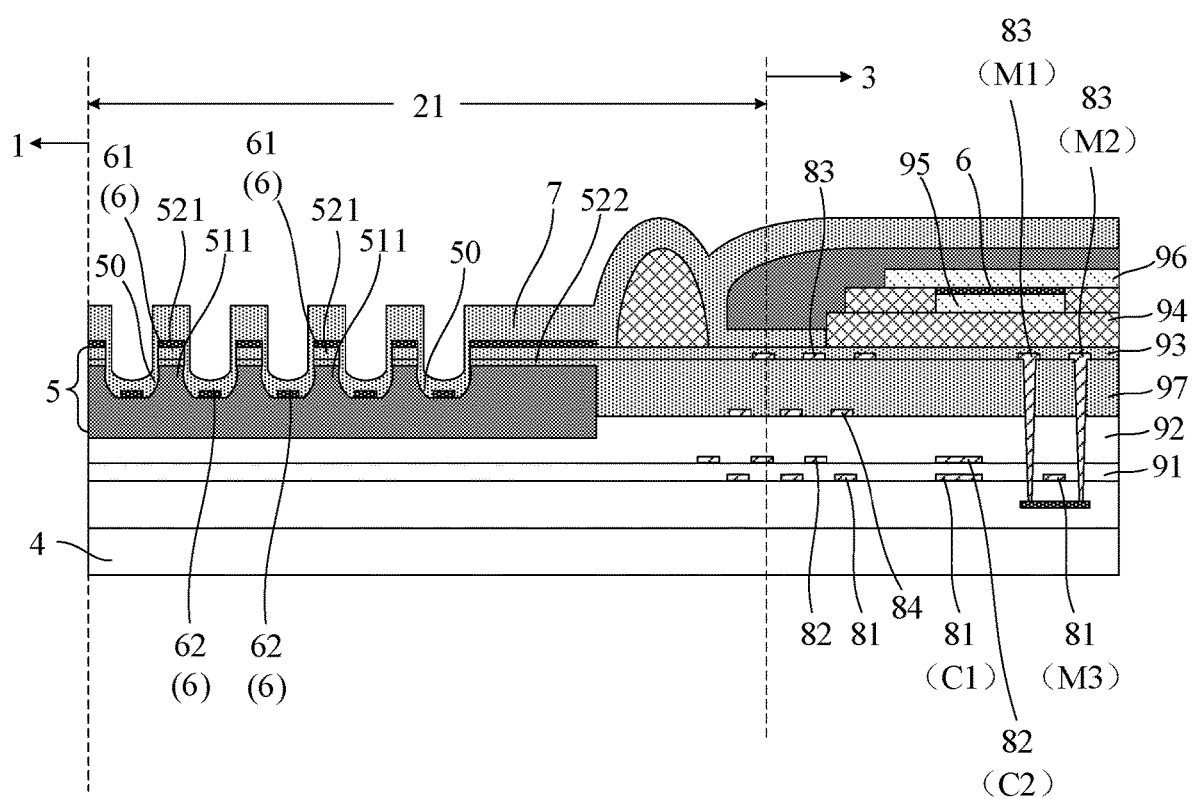
FIG. 11 is another sectional view of the display panel taken along line AA' in FIG. 1.

FIG. 11 is another sectional view of the display panel taken along line AA' in FIG. 1. In an embodiment, as shown in FIG. 11, the blocking layer 5 further includes a second inorganic insulating layer 522 located between the first inorganic insulating layer 521 and the first organic insulating layer 511. The groove 50 penetrates through the second inorganic insulating layer 522. The second inorganic insulating layer 522 and the fourth insulating layer 87 are disposed in a same layer. When the display panel includes the third metal layer 83 and the fourth metal layer 84, since the third insulating layer 93 and the fourth insulating layer 97 in the display area 3 serve as the dielectric layers of the two metal layers respectively, the first inorganic insulating layer 521 and the second inorganic insulating layer 522 that are located in the first non-display area 21 can be formed with the third insulating layer 93 and the fourth insulating layer 97 simultaneously. In the formation of the groove 50, the first inorganic insulating layer 521 and the second insulating layer 522 are penetrated through, so the two inorganic insulating layers will not lead to crack propagation and can increase the step of the groove 50. The etching rate of the inorganic insulating layer is higher than that of the organic insulating layer.

Figure 12:
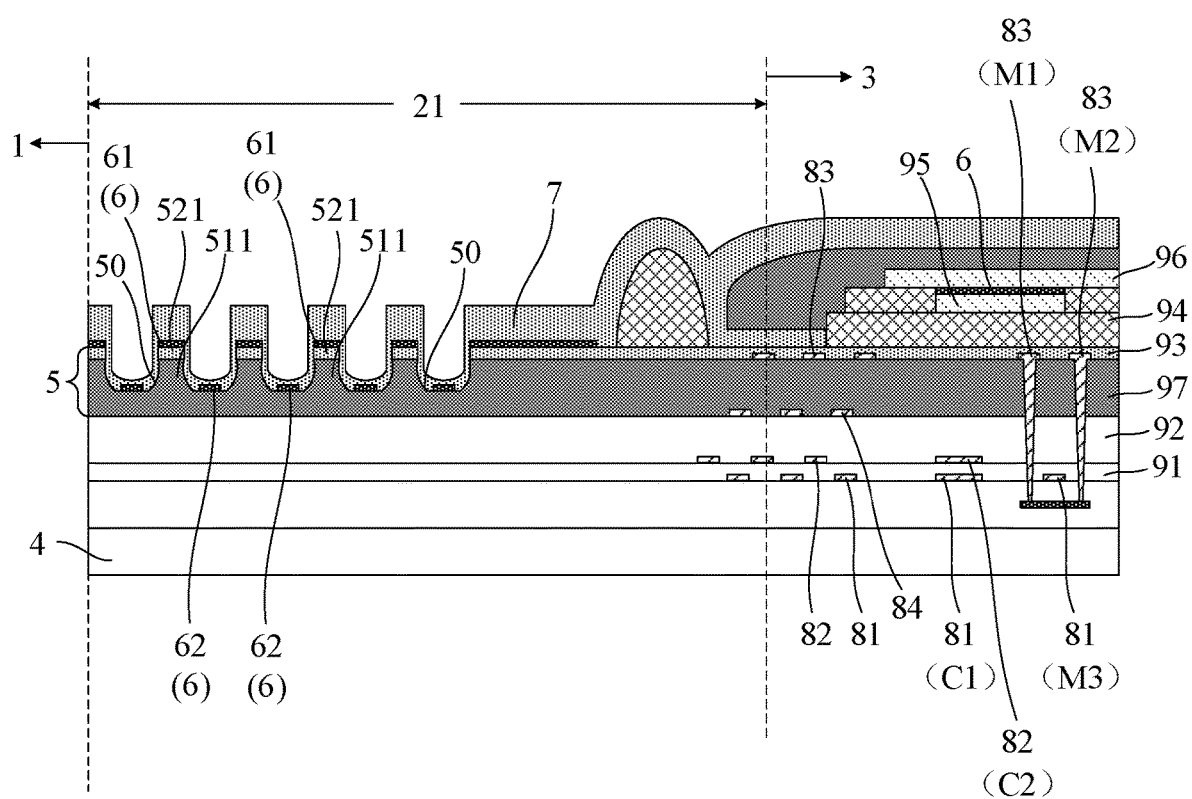
FIG. 12 is another sectional view of the display panel taken along line AA' in FIG. 1.

FIG. 12 is another sectional view of the display panel taken along line AA' in FIG. 1. In an embodiment, as shown in FIG. 12, the first organic insulating layer 511 and the fourth insulating layer 97 are disposed in a same layer, that is, the organic insulating layer serves as a dielectric layer of the fourth metal layer 84, and there is no need to additionally manufacture a dielectric layer of the fourth metal layer 84, thereby saving the process cost.

In one or more embodiments, as shown in FIG. 2, the blocking layer 5 further includes a second inorganic insulating layer 522, and the first organic insulating layer 511 is located between the first inorganic insulating layer 521 and the second inorganic insulating layer 522. The groove 50 penetrates through the first organic insulating layer 511. The bottom of the groove 50 is formed by the second inorganic insulating layer 522. The second inorganic insulating layer 522 and the fourth insulating layer 97 are disposed in a same layer. Since the inorganic encapsulation layer 7 has a strong bonding strength with the inorganic material, by forming the bottom of the groove 50 using the second inorganic insulating layer 522, the inorganic encapsulation layer 7 is bonded to the second inorganic insulation layer 522 at the bottom of the groove 50, which increases the encapsulation effect.

In one or more embodiments, as shown in FIG. 2, the organic light emitting display panel further includes an organic planarization layer 11 located at a side of the inorganic encapsulation layer 7 facing away from the organic light emitting layer 6. In the first non-display area 21, a groove formed by the inorganic encapsulation layer 7 in the groove 50 is filled with the organic planarization layer 11. The organic planarization layer 11 is used for planarizing a surface of the organic light emitting display panel. After the organic planarization layer 11 is formed, a touch layer is formed at a side of the organic planarization layer 11 facing away from the substrate layer 4 so as to implement the touch function. At the same time, the organic planarization layer 11 is filled in the groove formed by the inorganic encapsulation layer 7 so as to enhance the encapsulation effect of the inorganic encapsulation layer 7 in the groove 50. It should be noted that although the organic planarization layer 11 is illustrated in FIG. 2, it should be understood that the organic planarization layer 11 can be arranged in structures shown in drawings of other embodiments of the present disclosure.

In an embodiment, the inorganic encapsulation layer 7 and the organic planarization layer 11 extend from the first non-display area 21 into the display area 3, and the inorganic encapsulation layer 7 is located at a side of the cathode layer 96 facing away from the organic light emitting layer 6. The organic light emitting display panel in the display area further includes an organic encapsulation layer 12 located between the inorganic encapsulation layer 7 and the cathode layer 96. The first non-display area 21 further includes a blocking wall 13 located between the inorganic encapsulation layer 7 and the first inorganic insulating layer 521. The blocking wall 13 is arranged along an edge of the first non-display area 21 close to the display area 3, and the organic encapsulation layer 12 is defined in a region enclosed by the blocking wall 13. The organic encapsulation layer 12 is arranged at a side of the blocking wall 13 close to the display area 3. The organic encapsulation layer 12 is used for encapsulating structures in the display area 3, such as light emitting devices and the like, and the blocking wall 13 is used for restricting a position of the organic encapsulation layer 12.

In one or more embodiments, the first organic insulating layer 511 includes a photosensitizer material for increasing the etching rate in a process of forming the groove 50 through the first organic insulating layer 511.

It should be noted that, the quantity of the groove 50 is not limited in the present disclosure. For example, the blocking layer can include multiple grooves 50. The multiple grooves 50 can have a same depth, or the multiple grooves 50 can have different depths. The depth of the groove 50 can be configured according to actual needs, which is not limited in this disclosure.

In one or more embodiments, the groove 50 includes a first groove and a second groove, the first groove is located between the second groove and the opening area 1, and in a direction perpendicular to the substrate layer 4, a depth of the first groove is greater than a depth of the second groove. The first groove having a larger depth than that of the second groove disconnects the organic light emitting layer 6 and cut off the intrusion path of the water and oxygen. The second groove having a smaller depth than that of the first groove keeps a completeness of an encapsulation at the groove, which provides a better encapsulation. The second groove close to the display area has a smaller depth than that of the first groove. Since the encapsulation prevents water and oxygen from entering the display area, the groove providing a better encapsulation and having a smaller depth is arranged close to the display area, and a groove having a greater depth can cut off the intrusion path of the water and oxygen as long as the groove having a greater depth can disconnect the organic light emitting layer. That is, the first groove is arranged close to the opening area.

In one or more embodiments, one groove 50 includes a bottom and a sidewall intersecting with the bottom, and an included angle formed between the bottom and the sidewall is greater than 0 degree and smaller than or equal to 90 degrees, such that the groove 50 has a structure of which an upper part is narrow than a lower part, thereby completely disconnecting the organic light emitting layer.

Figure 13:
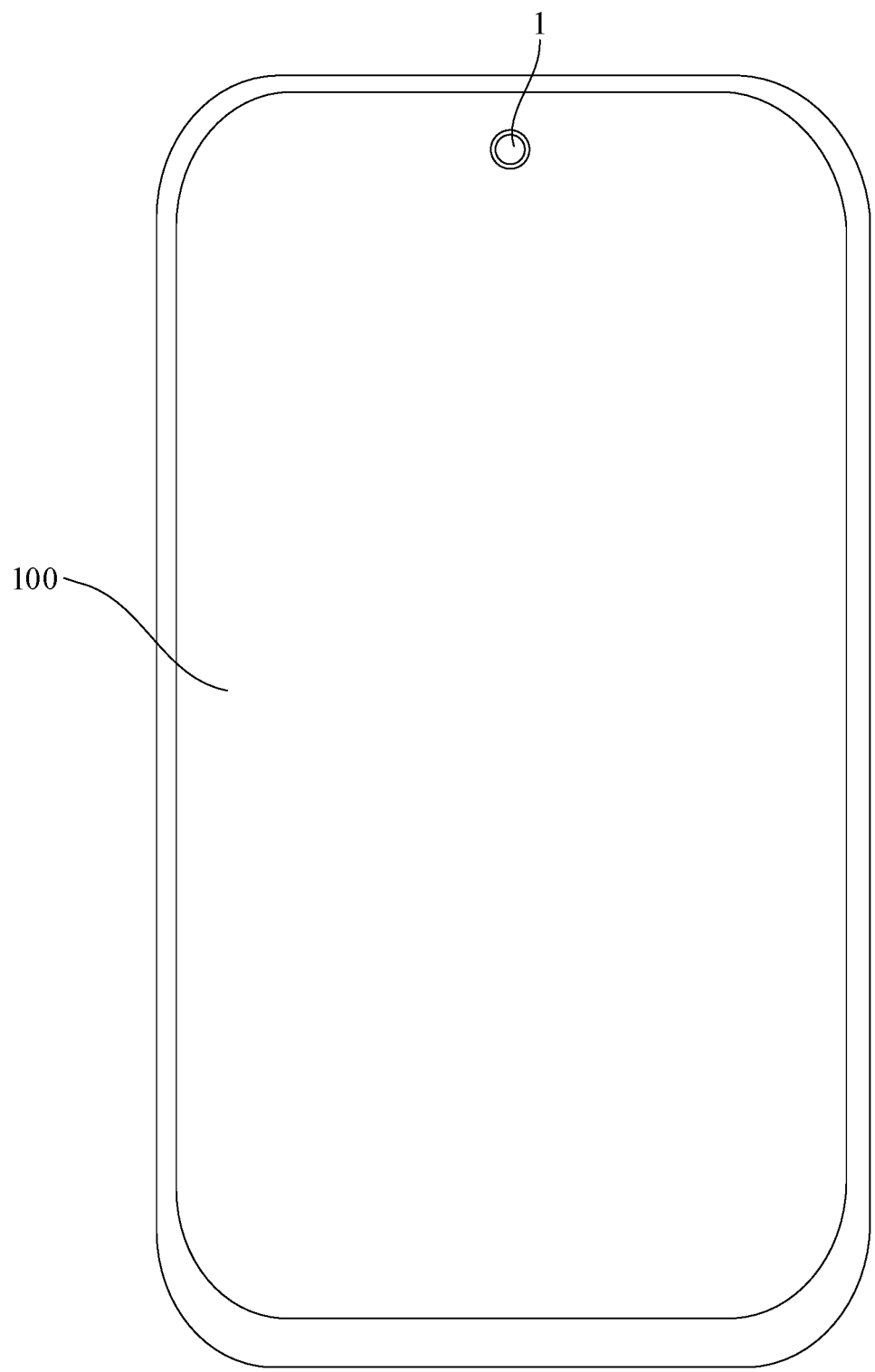
FIG. 13 is a schematic diagram of a display device according to some embodiments of the present disclosure.

In another aspect, some embodiments of the present disclosure provide a display device. FIG. 13 is a schematic diagram of a display device according to some embodiments of the present disclosure. As shown in FIG. 13, the display device includes the organic light emitting display panel 100.

The organic light emitting display panel 100 has a structure and principle same as the structure in above embodiments, which are not repeated here. The display device in the embodiments of the present disclosure can be any electronic device with a display function, for example, a touch display screen, a cell phone, a tablet, a notebook, an e-book, a television, and the like.

The above are merely exemplary embodiments of the present disclosure and do not intend to limit the present disclosure. Any modifications, equivalent alternatives, improvements, etc., which are made within the spirit and principles of the present application, should be included in the protection scope of the present application.

It should be noted that the above embodiments are for explaining the technical solutions of the present disclosure, and are not for limiting the disclosure. Although the present disclosure has been described in detail with reference to the foregoing embodiments, those skilled in the art should understand that the technical solutions described in the foregoing embodiments can be modified, or some or all the technical features can be equivalently replaced. Such modification and alternations do not cause the corresponding technical solutions deviate from the scope of the technical solutions of the embodiments of the present application.

What is claimed is:

1. An organic light emitting display panel having an opening area, a first non-display area surrounding the opening area, and a display area surrounding the first non-display area, the organic light emitting display panel comprising:
    a substrate layer, a blocking layer and an organic light emitting layer that are stacked and located in the first non-display area, wherein the organic light emitting layer is located at a side of the blocking layer facing away from the substrate layer, the blocking layer comprises a first organic insulating layer and a first inorganic insulating layer, the first inorganic insulating layer is located between the organic light emitting layer and the first organic insulating layer, and the substrate layer is at a side of the blocking layer facing away from the organic light emitting layer, wherein the blocking layer is provided with at least one groove formed by recessing towards a side close to the substrate layer, the at least one groove penetrates through the first inorganic insulating layer and is formed in the first organic insulating layer, and in a direction from the display area to the opening area, one of the at least one groove has an opening size smaller than a maximum size of the one of the at least one groove, wherein the organic light emitting layer is disconnected at the at least one groove.

2. The organic light emitting display panel according to claim 1, wherein the organic light emitting layer comprises a first part and a second part, the first part being arranged on a surface of the blocking layer outside the at least one groove, the second part being arranged on a bottom of the at least one groove, and the first part and the second part are disconnected from each other, and wherein the organic light emitting display panel further comprises an inorganic encapsulation layer located at a side of the organic light emitting layer facing away from the blocking layer, and the inorganic encapsulation layer covers the first part, the second part, and a side wall of the at least one groove.

3. The organic light emitting display panel according to claim 1, wherein the blocking layer further comprises a metal cushion layer located between the first inorganic insulating layer and the first organic insulating layer, and the at least one groove penetrates through the metal cushion layer.

4. The organic light emitting display panel according to claim 3, wherein the metal cushion layer surrounds the opening area to form an enclosed ring-shaped structure that is electrically connected to a fixed potential.

5. The organic light emitting display panel according to claim 3, wherein the metal cushion layer surrounds the opening area to form a broken ring-shaped structure that is electrically connected to a fixed potential.

6. The organic light emitting display panel according to claim 1, wherein the first non-display area comprises a crack propagation preventing area surrounding the opening area, and the at least one groove is disposed in the crack propagation preventing area, and wherein in the crack propagation preventing area, only a first layer made of an organic material is provided between the first inorganic insulating layer and the substrate layer, and the first layer made of the organic material comprises the first organic insulating layer.

7. The organic light emitting display panel according to claim 1, wherein the organic light emitting display panel has a second non-display area surrounding the display area, wherein the second non-display area comprises a bending area and a bonding area, and the bonding area is located at a side of the bending area away from the display area; and the bending area comprises a metal wiring layer and an organic protecting layer that are stacked, and the organic protecting layer and the first organic insulating layer are disposed in a same layer.

8. The organic light emitting display panel according to claim 1, wherein the blocking layer further comprises a second inorganic insulating layer, and the first organic insulating layer is located between the first inorganic insulating layer and the second inorganic insulating layer; and wherein the at least one groove penetrates through the first organic insulating layer, and a bottom of the at least one groove is formed by the second inorganic insulating layer.

9. The organic light emitting display panel according to claim 1, wherein the blocking layer further comprises a second organic insulating layer, and the first organic insulating layer is located between the first inorganic insulating layer and the second organic insulating layer, wherein the at least one groove penetrates through the first organic insulating layer, and a bottom of the at least one groove is formed by the second organic insulating layer, wherein the organic light emitting display panel further has a second non-display area surrounding the display area, the second non-display area comprises a bending area and a bonding area, and the bonding area is located at a side of the bending area facing away from the display area, and wherein the organic light emitting display panel further comprises a first metal wiring layer, a first organic protecting layer, a second metal wiring layer, and a second organic protecting layer that are located in the bending area and are sequentially stacked, wherein the first organic protecting layer and the first organic insulating layer are disposed in a same layer, and the second organic protecting layer and the second organic insulating layer are disposed in a same layer.

10. The organic light emitting display panel according to claim 1, wherein a bottom of the at least one groove is formed by the first organic insulating layer.

11. The organic light emitting display panel according to claim 2, further comprising:

a first metal layer, a first insulating layer, a second metal layer, a second insulating layer, a third metal layer, a third insulating layer, a planarization layer, an anode layer, an organic light emitting layer, and a cathode layer that are located in the display area and are stacked sequentially, wherein the first inorganic insulating layer and the third insulating layer are disposed in a same layer;

a thin film transistor, wherein the thin film transistor comprises a source electrode, a drain electrode and a gate electrode that are located in the display area; and a capacitor comprising a first electrode plate and a second electrode plate, wherein the gate electrode and the first electrode plate are located in the first metal layer, the second electrode plate is located in the second metal layer, and the source electrode and the drain electrode are located in the third metal layer.

12. The organic light emitting display panel according to claim 11, further comprising a fourth metal layer and a fourth insulating layer that are located in the display area, wherein the fourth metal layer is located between the third metal layer and the second insulating layer, and the fourth insulating layer is located between the third metal layer and the fourth metal layer, wherein a part of the source electrode is located in the third metal layer and another part of the source electrode is located in the fourth metal layer, or a part of the drain electrode is located in the third metal layer and another part of the drain electrode is located in the fourth metal layer.

13. The organic light emitting display panel according to claim 12, wherein the blocking layer further comprises a second inorganic insulating layer located between the first inorganic insulating layer and the first organic insulating layer, and the at least one groove penetrates through the second inorganic insulating layer, wherein the second inorganic insulating layer and the fourth insulating layer are disposed in a same layer.

14. The organic light emitting display panel according to claim 12, wherein the first organic insulating layer and the fourth insulating layer are disposed in a same layer.

15. The organic light emitting display panel according to claim 12, wherein the blocking layer further comprises a second inorganic insulating layer, and the first organic insulating layer is located between the first inorganic insulating layer and the second inorganic insulating layer; the at least one groove penetrates through the first organic insulating layer, and a bottom of the at least one groove is formed by the second inorganic insulating layer; and the second inorganic insulating layer and the fourth insulating layer are disposed in a same layer.

16. The organic light emitting display panel according to claim 12, further comprising an organic planarization layer located at a side of the inorganic encapsulation layer facing away from the organic light emitting layer, wherein in the first non-display area, a groove of the inorganic encapsulation layer formed in the at least one groove is filled with the organic planarization layer.

17. The organic light emitting display panel according to claim 16, wherein the inorganic encapsulation layer and the organic planarization layer each extend from the first non-display area into the display area, and the inorganic encapsulation layer is located at a side of the cathode layer facing away from the organic light emitting layer, wherein the organic light emitting display panel further comprises an organic encapsulation layer located in the display area and located between the inorganic encapsulation layer and the cathode layer, and wherein the organic light emitting display panel further comprises a blocking wall located in the first non-display area and located between the inorganic encapsulation layer and the first inorganic insulating layer, wherein the blocking wall is arranged along an edge of the first non-display area close to the display area, and the organic encapsulation layer is arranged at a side of the blocking wall close to the display area.

18. The organic light emitting display panel according to claim 1, wherein the at least one groove comprises a first groove and a second groove, wherein the first groove is located between the second groove and the opening area, and in a direction perpendicular to the substrate layer, a depth of the first groove is greater than a depth of the second groove.

19. The organic light emitting display panel according to claim 1, wherein one of the at least one groove comprises a bottom and a sidewall intersecting with the bottom, and an included angle formed between the bottom and the sidewall is greater than 0 degree and smaller than or equal to 90 degrees.

20. A display device, comprising:

an organic light emitting display panel, wherein the organic light emitting display panel has an opening area, a first non-display area surrounding the opening area, and a display area surrounding the first non-display area, the organic light emitting display panel comprising:

a substrate layer, a blocking layer, and an organic light emitting layer that are stacked and located in the first non-display area, wherein the organic light emitting layer is located at a side of the blocking layer facing away from the substrate layer, the blocking layer comprises a first organic insulating layer and a first inorganic insulating layer, the first inorganic insulating layer is located between the organic light emitting layer and the first organic insulating layer, and the substrate layer is at a side of the blocking layer facing away from the organic light emitting layer, wherein the blocking layer is provided with at least one groove formed by recessing towards a side close to the substrate layer, the at least one groove penetrates through the first inorganic insulating layer and is formed in the first organic insulating layer, and in a direction from the display area to the opening area, one of the at least one groove has an opening size smaller than a maximum size of the one of the at least one groove, wherein the organic light emitting layer is disconnected at the at least one groove.

* * * * *